United States Patent

[11] 3,624,558

[72] Inventor Stephen Joseph Brolin
Bronx, N.Y.
[21] Appl. No. 3,312
[22] Filed Jan. 16, 1970
[45] Patented Nov. 30, 1971
[73] Assignee Bell Telephone Laboratories, Incorporated
Murray Hill, N.J.

[54] DELTA MODULATION ENCODER HAVING DOUBLE INTEGRATION
3 Claims, 3 Drawing Figs.

[52] U.S. Cl. .......... 332/11 D,
307/237, 325/38 B
[51] Int. Cl. .......... H03k 13/22
[50] Field of Search .......... 332/11, 11
D; 325/38, 38.1; 307/237

[56] References Cited
UNITED STATES PATENTS

| | | | |
|---|---|---|---|
| 2,721,308 | 10/1955 | Levy | 332/11 D |
| 3,303,425 | 2/1967 | Pendleton | 307/237 X |
| 3,462,686 | 8/1969 | Shutterly | 325/38.1 |
| 3,500,205 | 3/1970 | Tudor-Owen | 332/11 D |
| 3,524,081 | 8/1970 | Campanella | 307/237 X |

*Primary Examiner*—Alfred L. Brody
*Attorneys*—R. J. Guenther and E. W. Adams, Jr.

ABSTRACT: A delta modulation encoder has a second integrator for producing more rapid alternations in the noise signal, thereby removing a portion of the noise from the signal frequency band. The integrator is clamped to prevent excessive overshoots.

INVENTOR
S. J. BROLIN
BY David P. Kelley
ATTORNEY

DELTA MODULATION ENCODER HAVING DOUBLE INTEGRATION

BACKGROUND OF THE INVENTION

This invention relates to pulse transmission arrangements, and, more particularly, to the encoding of analog signals into a delta modulation format.

The basic delta modulation encoder comprises an integrator to which the transmitted pulses are applied via feedback, and a comparator which compares the analog signal to the integrator output. Depending upon the difference noted by the comparator, a pulse or no pulse is transmitted. Such systems have the virtue of simplicity, but are characterized by large amounts of overload and quantizing noise. Overload noise occurs where the analog signal changes so rapidly that the integrator cannot follow it, and quantizing noise results from the inability of the integrator, the output of which is a step or ramp function, to follow the signal exactly.

Various arrangements have been proposed to correct for overload noise, such as for example, adaptive delta modulation arrangements and various forms of signal compounding. Systems have also been proposed for reduction of quantizing noise, such as the addition of a second integrator to produce a more accurate tracking of the analog signal by the integrators. However, double integration arrangements can lead to instability of the encoder causing it, under certain conditions, to break into oscillation.

SUMMARY OF THE INVENTION

The present invention is directed to the reduction of quantizing noise, or, more specifically, of the effect thereof, by the use of double integration, and further, to nullify the instability producing effects of a second integrator.

In an illustrative embodiment of the invention, a second integrator is connected between the output of the comparator and ground at a point between the comparator and the pulse-generating circuit. The integrator has the effect of reducing quantizing noise by providing a short time average of the quantizing error in the output of the comparator and effectively shifting the decision level of the pulse generator to produce a more rapid alternation of the error polarity. As a consequence, a large amount of the noise power is shifted to frequencies above the signal band, where it can readily be filtered out.

It is a feature of the present invention that the capacitor of the second integrator is clamped to a voltage range that prevents the capacitor from charging too large values that would lead to instabilities upon the occurrence of large signal transients.

DESCRIPTION OF THE DRAWING

The various features of the present invention will be more readily understood from the following detailed description, taken in conjunction with the accompanying drawings, in which.

DETAILED DESCRIPTION

Figure 1:
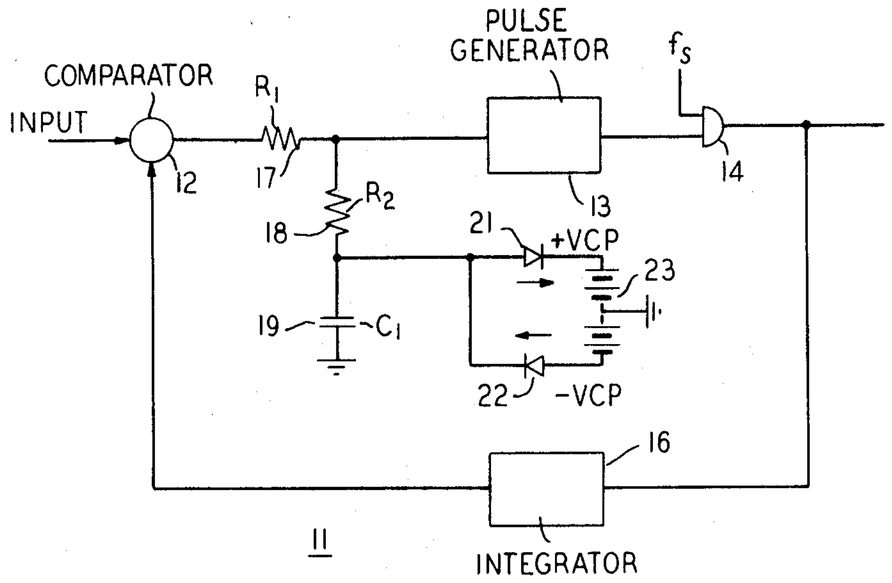
FIG. 1 is a block diagram of a delta modulation encoder embodying the principles of the invention.

The arrangement of FIG. 1 is a delta modulation encoder 11 comprising a comparator 12, pulse generator 13, and gate 14 under control of clock pulses $f_s$ from a source, not shown, and integrator 16, all of which are standard elements of a delta modulation encoder. Such encoders compare the output of the integrator with the incoming analog signal and apply the difference to pulse generator 13 which, depending upon the sign of the difference, produces a pulse or no pulse. The pulses are transmitted through gate 14 and also fed back to integrator 16.

Connected between comparator 12 and pulse generator 13 is a second integrator circuit comprising a series resistance 17($R_1$), a shunt resistance 18($R_2$) and a capacitor 19($C_1$) having one plate connected to ground. In accordance with the principles of the present invention a pair of oppositely poled diodes 21 and 22 are connected as shown between resistor 18 and capacitor 19. Diodes 21 and 22 are biased by a suitable voltage source 23 so that diode 21 is back-biased to a value +VCP and diode 22 is back-biased to a value −VCP. As a consequence, the charge on capacitor 19 is clamped between the values +VCP and −VCP. Any capacitor voltage outside this range causes one or the other of diodes 21 and 22 to conduct, thereby discharging capacitor 19 to the clamped level of voltage.

Figure 2A:
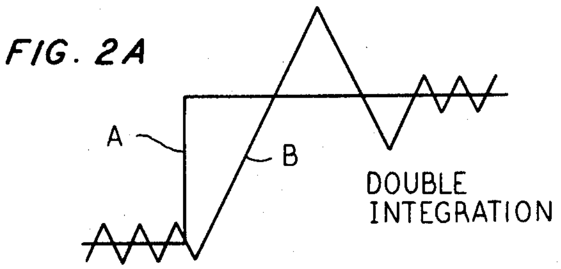
FIGS. 2A and 2B are curves illustrating the performance of the circuit of FIG. 1 without and with, respectively, a feature of the invention.
Figure 2B:
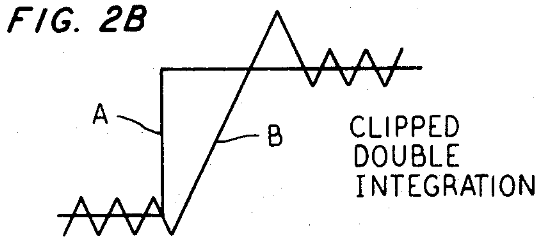

In operation, the magnitude of the voltage VCP is chosen to be large enough that the clamping action rarely occurs under small signal conditions. On the other hand, the magnitude is small enough that large input transients, which would normally cause capacitor 19 to produce an overshoot are prevented from doing so. The action of the circuit of FIG. 1, without the clamping action of diodes 21 and 22, is illustrated in FIG. 2A for an analog signal having a rapid rise, i.e., large transient, while the action of the circuit with clamping is shown in FIG. 2B. In both figures the analog signal is designated as curve A and the integrator input to the comparator 12 is designated as curve B. It can be seen that, without clamping, there is a large positive overshoot by integrator 16, followed by a large negative overshoot. On the other hand, with clamping, the positive overshoot is much smaller, and the negative overshoot is eliminated.

Capacitor 19 provides a short time average of modulation error (quantizing noise) and acts to bias the input to pulse generator 13, in effect altering its decision level. This in turn produces a more rapid alternation of the polarity of errors, thereby causing more of the noise power to be above the signal frequency band, where it may be filtered out. Diodes 21 and 22, on the other hand, prevent capacitor 19 from charging to a value large enough to cause a large overshoot where the output of integrator 16 overtakes the input signal. In the action illustrated in FIG. 2A, this overshoot occurs because the large voltage on capacitor 19 makes it appear to the system that the input signal has not been overtaken.

The foregoing embodiment of the principles of the invention is for the purpose of illustrating those principles. Other arrangements embodying this principle may occur to workers in the art without departure from the spirit and scope of the invention.

What is claimed is:

1. A delta modulation encoder for converting an analog signal into a digital pulse signal, the analog signal being characterized by the occurrence of large transients, said encoder comprising a first integrator circuit, means for comparing the output of said integrator with the analog signal to produce a difference signal, means responsive to the output of the comparing means for producing a digital signal output indicative of the sign of the difference, means for feeding back the digital signal output to said integrator, means comprising a series combination of a resistor and a capacitor connected from a point between said comparing means and the digital signal producing means to ground for producing a short term average of the difference between the analog signal and the integrator output, and means connected across said capacitor for reducing the magnitude of overshoot of said integrator upon the occurrence of large signal transients comprising means for maintaining a fixed charge on said capacitor.

2. A delta modulation encoder as claimed in claim 1 wherein the means for maintaining the short term average between predetermined limits comprises a pair of oppositely poled diodes connected to one plate of said capacitor.

3. A delta modulation encoder as claimed in claim 2 and further including means for back-biasing said diodes to the said predetermined limits.

* * * * *